United States Patent
Kim et al.

(10) Patent No.: US 9,921,286 B2
(45) Date of Patent: Mar. 20, 2018

(54) MAGNETIC RESONANCE IMAGING APPARATUS AND METHOD

(71) Applicants: SAMSUNG ELECTRONICS CO., LTD., Suwon-si (KR); Korea University Research and Business Foundation, Seoul (KR)

(72) Inventors: Su-gil Kim, Seoul (KR); Yeol-min Seong, Seoul (KR); Sang-cheon Choi, Seoul (KR)

(73) Assignees: SAMSUNG ELECTRONICS CO., LTD., Suwon-si (KR); Korea University Research and Business Foundation, Seoul (KR)

( * ) Notice: Subject to any disclaimer, the term of this patent is extended or adjusted under 35 U.S.C. 154(b) by 732 days.

(21) Appl. No.: 14/513,453

(22) Filed: Oct. 14, 2014

(65) Prior Publication Data

US 2015/0108977 A1  Apr. 23, 2015

(30) Foreign Application Priority Data

Oct. 23, 2013 (KR) .................. 10-2013-0126727

(51) Int. Cl.

| | |
|---|---|
| G01V 3/00 | (2006.01) |
| G01R 33/561 | (2006.01) |
| G01R 33/385 | (2006.01) |
| G01R 33/58 | (2006.01) |
| G01R 33/48 | (2006.01) |
| G01R 33/563 | (2006.01) |

(52) U.S. Cl.
CPC ........ *G01R 33/5611* (2013.01); *G01R 33/385* (2013.01); *G01R 33/4818* (2013.01); *G01R 33/56308* (2013.01); *G01R 33/58* (2013.01)

(58) Field of Classification Search
CPC ............. G01R 33/5611; G01R 33/385; G01R 33/4818; G01R 33/56308; G01R 33/58
USPC ........................................... 324/309
See application file for complete search history.

(56) References Cited

U.S. PATENT DOCUMENTS

| | | | |
|---|---|---|---|
| 6,556,009 B2 | 4/2003 | Kellman et al. | |
| 7,394,252 B1 * | 7/2008 | Lin .................... | G01R 33/5611 324/307 |
| 2006/0050981 A1 | 3/2006 | Huang | |

(Continued)

OTHER PUBLICATIONS

Communication dated Jan. 28, 2015 issued by the European Patent Office in counterpart European Patent Application No. 14189677.9.

(Continued)

*Primary Examiner* — Susan Lee
(74) *Attorney, Agent, or Firm* — Sughrue Mion, PLLC

(57) ABSTRACT

The MRI apparatus includes a data processor, which time-serially performs undersampling on MR signals respectively received by coil channels included in a radio frequency (RF) multi-coil to acquire undersampled K-t space data, and an image processor that acquires a time-space correlation coefficient, based on noise information of the coil channels, and restores pieces of unacquired line data from the undersampled K-t space data by using the time-space correlation coefficient to acquire restored K-t space data, thereby increasing an accuracy of the time-space correlation coefficient to improve a quality of an image.

22 Claims, 11 Drawing Sheets

(56) References Cited

U.S. PATENT DOCUMENTS

2009/0224759 A1 9/2009 Kholmovski et al.
2013/0076352 A1* 3/2013 Block ............... G01R 33/5611
　　　　　　　　　　　　　　　　　　　　　　324/307

OTHER PUBLICATIONS

F Huang et al: "Convolution Kernel Decision Scheme for Reconstruction in K-T/K Space", Pro. Intl. Soc. Mag. Reson. Med. 14, Jan. 1, 2006, pp. 3650, XP055163492.
Feng Huang et al: "K-T Grappa:A K-Space Implementation for Dynamic MRI With High Reduction Factor", Magnetic Resonance in Medicine, vol. 54, No. 5, 2005-01-01, pp. 1172-1184, XP055163493.
Xue Feng et al: "Kalman Filter Techniques for Accelerated Cartesian Dynamic Cardiac Imaging", Magnetic Resonance in Medicine, vol. 69, No. 5, 2012-08-27, pp. 1346-1356, XP055163497.
Tiejun Zhao et al: "Interative Grappa (Igrappa) for Improved Parallel Imaging Reconstruction", Magnetic Resonance in Medicine, vol. 59, No. 4, Jan. 1, 2008, pp. 903-907, XP055162898.
Suhyung Part et al: "Adaptive Self-Calibrating Iterative Grappa Reconstruction", Magnetic Resonance in Medicine, vol. 67, No. 6, Oct. 12, 2011, pp. 1721-1729, XP055163501.
Communication dated Feb. 27, 2015 issued by the Korean Intellectual Property Office in counterpart Korean Patent Application No. 10-2013-0126727.

* cited by examiner

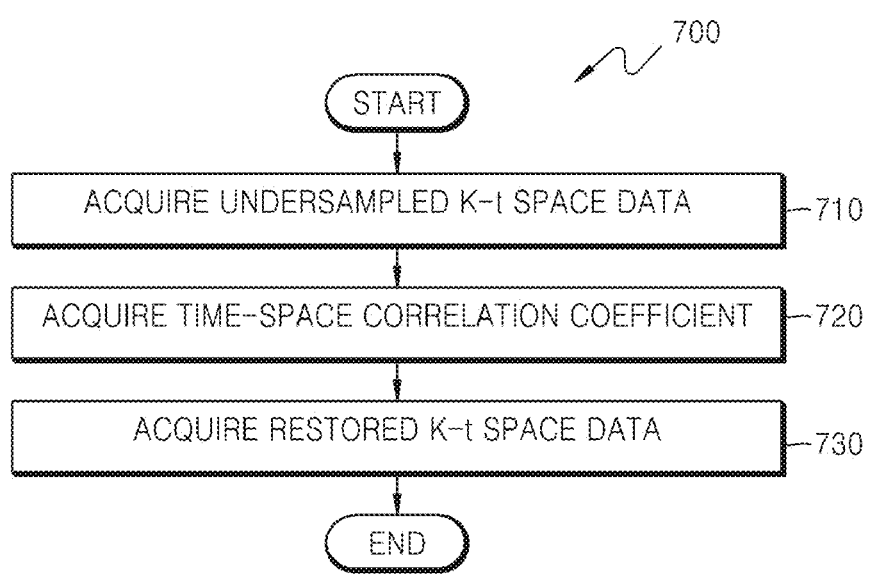

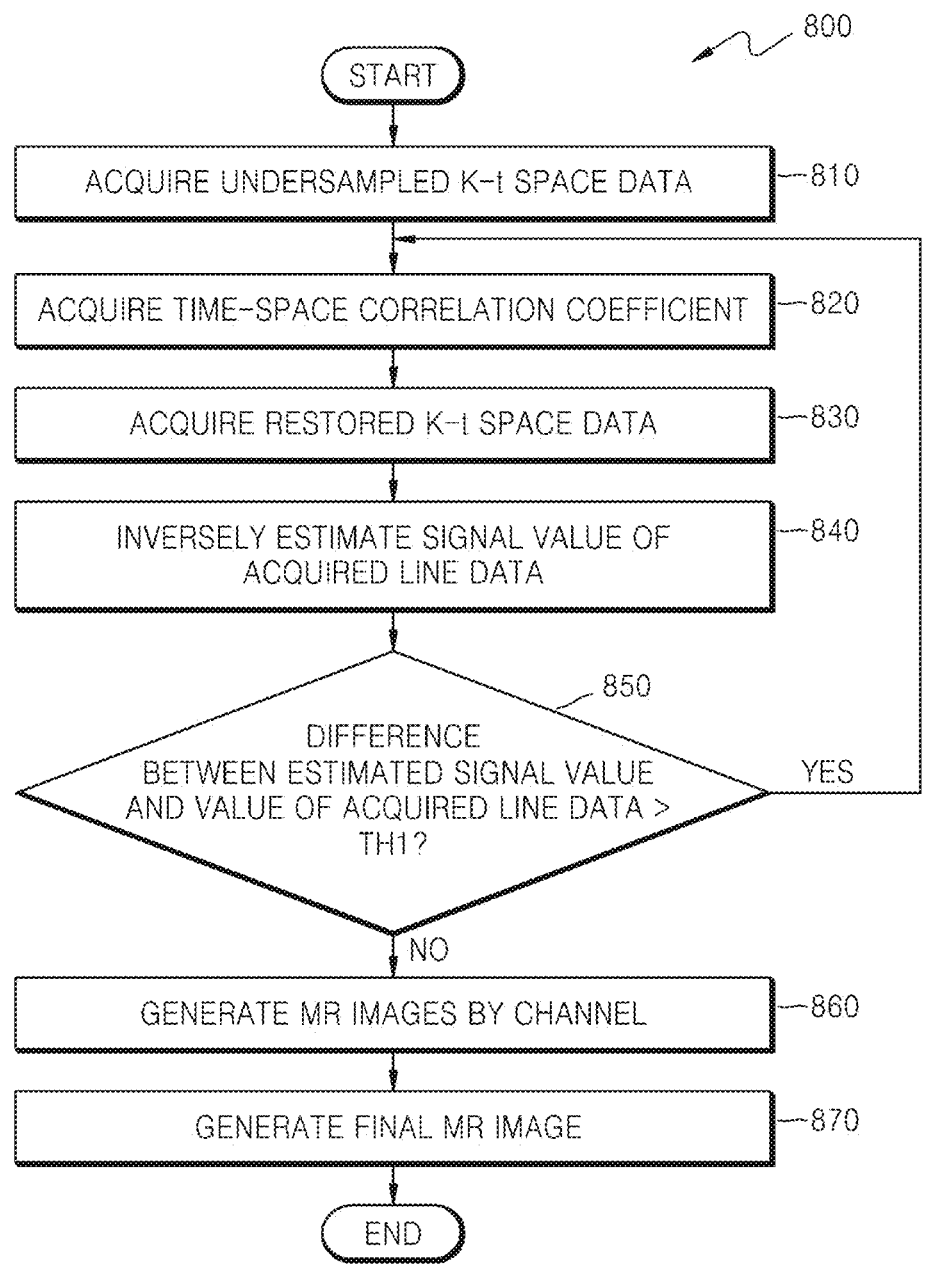

MAGNETIC RESONANCE IMAGING APPARATUS AND METHOD

CROSS-REFERENCE TO RELATED APPLICATION

This application claims priority from Korean Patent Application No. 10-2013-0126727, filed on Oct. 23, 2013, in the Korean Intellectual Property Office, the disclosure of which is incorporated herein in its entirety by reference.

BACKGROUND

1. Field

One or more exemplary embodiments relate to a magnetic resonance imaging (MRI) apparatus and method, and more particularly, to a time-space MRI apparatus and method which time-serially image a moving object based on a time space to generate an image of the object.

2. Description of the Related Art

MRI apparatuses image an object by using a magnetic field. MRI apparatuses may acquire two-dimensional (2D) images or three-dimensional (3D) volume images while not using X-ray radiation, as compared to computed tomography (CT), X-ray, position emission tomography (PET), and single photon emission CT (SPECT), and may acquire images having high soft tissue contrast, and may acquire images having high soft tissue contrast, neurological images, intravascular images, musculoskeletal images, and oncologic images that are important in detection of abnormal tissues.

MRI apparatuses may three-dimensionally show lumbar discs, joints, and nerve ligaments, in addition to bones, at a desired angle, and thus are being widely used for an accurate diagnosis.

MRI apparatuses acquire a magnetic resonance (MR) signal, reconfigure the acquired MR signal into an image, and output the image.

An example of an MRI method for processing an acquired MR signal includes GRAPPA technique.

In GRAPPA, a self-calibration is performed to calculate spatial correlations or convolution kernels between a calibration signal and a measured source signal adjacent thereto, to estimate an unmeasured signal.

However, in GRAPPA, when data of an image signal is damaged or a spatial interaction value is changed due to noise, aliasing artifacts and amplified noise of a finally acquired MR image occur.

Thus, in the related art time-space parallel MRI techniques that generate an image of a moving object in time series based on GRAPPA, due to a presence of noise in the data, it is difficult to accurately calculate a time-space correlation coefficient, and an accuracy of the time-space correlation coefficient may be reduced. An image, which is restored by using the time-space correlation coefficient of which accuracy is reduced due to noise, includes a lot of aliasing artifacts and noise. For this reason, it is difficult for a user to accurately read out an image.

SUMMARY

Exemplary embodiments may address at least the above problems and/or disadvantages and other disadvantages not described above. Also, the exemplary embodiments are not required to overcome the disadvantages described above, and an exemplary embodiment may not overcome any of the problems described above.

One or more exemplary embodiments include a time space-based MRI apparatus and method of restoring an image with no noise.

One or more exemplary embodiments include an MRI apparatus and method that restore a noise-removed image in consideration of noise of a coil channel when estimating a time-space correlation.

According to one or more exemplary embodiments, a magnetic resonance imaging (MRI) apparatus includes: a data processor that time-serially performs undersampling on magnetic resonance (MR) signals respectively received by a plurality of coil channels included in a radio frequency (RF) multi-coil to acquire undersampled K-t space data; and an image processor that acquires a time-space correlation coefficient, based on noise information of the plurality of coil channels, and restores pieces of unacquired line data from the undersampled K-t space data by using the time-space correlation coefficient to acquire restored K-t space data.

The image processor may calculate the time-space correlation coefficient based on the noise information of the plurality of coil channels, to reduce noise of the restored K-t space data.

The image processor may correct line data acquired from the undersampled K-t space data by using a Kalman filter, and calculate the time-space correlation coefficient by using the corrected line data.

The image processor may calculate a gain value of the Kalman filter based on the noise information of the plurality of coil channels, correct a signal value of the line data acquired from the undersampled K-t space data by using the calculated gain value, and calculate the time-space correlation coefficient by using the corrected signal value.

The image processor may inversely estimate the acquired line data included in the undersampled K-t space data by using the restored K-t space data and the time-space correlation coefficient.

When a difference between a value of the inversely estimated line data and a value of the acquired line data is greater than a threshold, the image processor may repeat an operation of acquiring the time-space correlation coefficient until the difference becomes less than or equal to the threshold.

The noise information may include a noise map of the plurality of coil channels.

When an RF signal is transmitted from the RF multi-coil, the noise information may be generated in correspondence with the transmitted RF signal, and may include an internal noise signal of a gantry which is acquired through each of the plurality of coil channels.

The data processor may time-serially perform undersampling on the MR signals to acquire the undersampled K-t space data having an echelon type.

The data processor may perform undersampling on the MR signals at one-line intervals in a K-space corresponding to each of the plurality of coil channels, and may additionally perform Nyquist-sampling in a central region of the K-space to acquire the undersampled K-t space data.

The image processor may perform a spatial transform on pieces of the restored K-t space data respectively corresponding to the plurality of coil channels to generate MR images by channel, and acquire a final MR image by using the MR images by channel.

The image processor may perform an inverse Fourier transform the pieces of restored K-t space data to generate the MR images by channel.

The image processor may calculate a sum of squares or complex sum of the MR images by channel to acquire the final MR image.

According to one or more exemplary embodiments, a magnetic resonance imaging (MRI) method includes: time-serially performing undersampling on magnetic resonance (MR) signals respectively received by a plurality of coil channels included in a radio frequency (RF) multi-coil to acquire undersampled K-t space data; acquiring a time-space correlation coefficient, based on noise information of the plurality of coil channels; and restoring pieces of unacquired line data from the undersampled K-t space data by using the time-space correlation coefficient to acquire restored K-t space data.

BRIEF DESCRIPTION OF THE DRAWINGS

The above and/or other aspects will become more apparent by describing certain exemplary embodiments, with reference to the accompanying drawings, in which:

FIG. 7 is a flowchart of an MRI method according to an exemplary embodiment;

FIG. 8 is a flowchart of an MRI method according to an exemplary embodiment;

DETAILED DESCRIPTION

Figure 1:
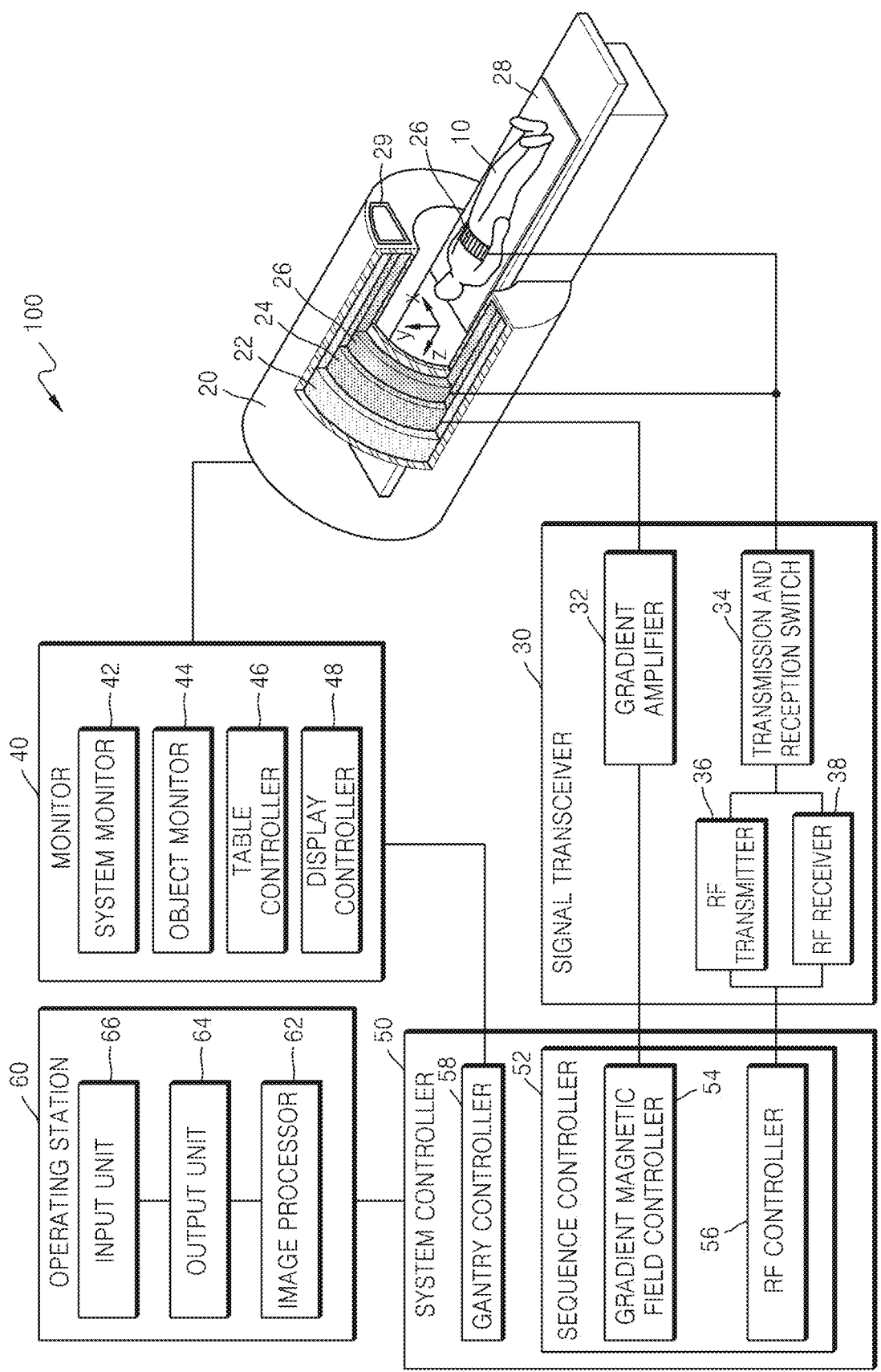
FIG. 1 is a block diagram of an MRI system.

Certain exemplary embodiments are described in greater detail below with reference to the accompanying drawings.

In the following description, the same drawing reference numerals are used for the same elements even in different drawings. The matters defined in the description, such as detailed construction and elements, are provided to assist in a comprehensive understanding of exemplary embodiments. Thus, it is apparent that exemplary embodiments can be carried out without those specifically defined matters. Also, well-known functions or constructions are not described in detail since they would obscure exemplary embodiments with unnecessary detail.

As used herein, the term "and/or" includes any and all combinations of one or more of the associated listed items. Expressions such as "at least one of," when preceding a list of elements, modify the entire list of elements and do not modify the individual elements of the list.

When something "includes" a component, another component may be further included unless specified otherwise. The term "unit" used in the present specification refers to a software component, or a hardware component such as FPGA or ASIC, and performs a certain function. However, the "unit" is not limited to software or hardware. The "unit" may be configured in an addressable storage medium and may be configured to be executed by one or more processors. Hence, the "unit" includes elements such as software elements, object-oriented software elements, class elements, and task elements, and processes, functions, attributes, procedures, sub-routines, segments of program codes, drivers, firmware, micro-codes, circuits, data, databases, data structures, tables, arrays, and variables. The functions provided in the elements and the units may be combined into a fewer number of elements and units or may be divided into a larger number of elements and units.

In the present specification, "image" may refer to multi-dimensional data composed of discrete image elements (e.g., pixels in a two-dimensional image and voxels in a three-dimensional image). For example, an image may include a medical image of an object acquired by an X-ray, computed tomography (CT), magnetic resonance imaging (MRI), ultrasonic waves, or another medical image imaging apparatus.

An "object" may include a person or an animal, or a part of a person or an animal. For example, the object may include the liver, the heart, the womb, the brain, a breast, the abdomen, or a blood vessel. Furthermore, the "object" may include a phantom. The phantom means a material having a volume that is approximately the intensity and effective atomic number of a living thing, and may include a sphere phantom having a property similar to a human body.

A "user" refers to a medical professional, such as a doctor, a nurse, a medical laboratory technologist, and an engineer who repairs a medical apparatus, but the user is not limited thereto.

An "MRI" refers to an image of an object obtained by using the nuclear magnetic resonance principle.

A "pulse sequence" refers to sequence of signals repeatedly applied by an MRI apparatus. A pulse sequence may include a time parameter of a radio frequency (RF) pulse, for example, repetition time (TR) or echo time (TE).

An MRI system is an apparatus for acquiring a sectional image of a part of an object by expressing, in a contrast comparison, a strength of a MR signal with respect to a radio frequency (RF) signal generated in a magnetic field having a specific strength. For example, if an RF signal that resonates only a specific atomic nucleus (for example, a hydrogen atomic nucleus) is irradiated for an instant onto the object that is placed in a strong magnetic field and then such irradiation stops, an MR signal is emitted from the specific atomic nucleus, and thus the MRI system may receive the MR signal and acquire an MR image. The MR signal denotes an RF signal emitted from the object. An intensity of the MR signal may be determined according to density of a predetermined atom (for example, hydrogen) included in the object, a relaxation time T1, a relaxation time T2, and a blood flow.

FIG. 1 is a block diagram of an MRI system 100. Referring to FIG. 1, the MRI system may include a gantry 20, a signal transceiver 30, a monitor 40, a system controller 50, and an operating station 60.

The gantry 20 blocks electromagnetic waves generated by a main magnet 22, a gradient coil 24, and an RF coil 26 from being externally emitted. A magnetostatic field and a gradient magnetic field are formed at a bore in the gantry 20, and an RF signal is irradiated towards an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning a direction of magnetic dipole moments of atomic nuclei in the object 10 in a constant direction. A precise and accurate MR image of the object 10 may be obtained when a magnetic field generated by the main magnet 22 is strong and uniform.

The gradient coil 24 includes X, Y, and Z coils for generating gradient magnetic fields in X-, Y-, and Z-axis directions crossing each other at right angles. The gradient coil 24 may provide location information of each region of the object 10 by differently inducing resonance frequencies according to the regions of the object 10.

The RF coil 26 may irradiate an RF signal to a patient and receive an MR signal emitted from the object 10. For example, the RF coil 26 may transmit an RF signal at a same frequency as precessional motion to the patient towards atomic nuclei in precessional motion, stop transmitting the RF signal, and then receive an MR signal emitted from the object 10.

For example, in order to transit an atomic nucleus from a low energy state to a high energy state, the RF coil 26 may generate and apply an electromagnetic wave signal having an RF corresponding to a type of the atomic nucleus, for example, an RF signal, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus on which the electromagnetic waves were applied transits from the high energy state to the low energy state, thereby emitting electromagnetic waves having a Larmor frequency. In other words, when the applying of the electromagnetic wave signal to the atomic nucleus is stopped, an energy level of the atomic nucleus is changed from a high energy level to a low energy level, and thus the atomic nucleus may emit electromagnetic waves having a Larmor frequency. The RF coil 26 may receive electromagnetic wave signals from atomic nuclei in the object 10.

The RF coil 26 include one RF transmit and receive coil having both a function of generating electromagnetic waves having a wireless frequency corresponding to a type of an atomic nucleus and a function of receiving electromagnetic waves emitted from an atomic nucleus. Alternatively, the RF coil 26 include an RF transmit coil having a function of generating electromagnetic waves having a wireless frequency corresponding to a type of an atomic nucleus, and a separate RF receive coil having a function of receiving electromagnetic waves emitted from an atomic nucleus.

The RF coil 26 may be fixed to the gantry 20 or may be detachable. When the RF coil 26 is detachable, the RF coil 26 may be an RF coil for a part of the object, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may be a birdcage coil, a surface coil, or a transverse electromagnetic (TEM) coil according to structures.

The RF coil 26 may be a transmit only coil, a receive only coil, or a transmit and receive coil according to methods of transmitting and receiving an RF signal.

The RF coil 26 may be an RF coil in any one of various channels, such as 16 channels, 32 channels, 72 channels, and 144 channels.

The gantry 20 may further include a display 29 disposed outside the gantry 20 and a display disposed inside the gantry 20. The gantry 20 may provide predetermined information to the user or the object through the display 29 and the display disposed inside the gantry 20.

The signal transceiver 30 may control the gradient magnetic field formed inside the gantry 20, i.e., in the bore, according to a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 in the gantry 20, and may supply a pulse signal for generating a gradient magnetic field to the gradient coil 24 according to control of a gradient magnetic field controller 54. By controlling the pulse signal supplied from the gradient amplifier 32 to the gradient coil 24, gradient magnetic fields in X-, Y-, and Z-axis directions may be composed.

The RF transmitter 36 and the RF receiver 38 may drive the RF coil 26. The RF transmitter 36 may supply an RF pulse in a Larmor frequency to the RF coil 26, and the RF receiver 38 may receive an MR signal received by the RF coil 26.

The transmission and reception switch 34 may adjust transmitting and receiving directions of the RF signal and the MR signal. For example, the RF signal may be irradiated to the object 10 through the RF coil 26 during a transmission mode, and the MR signal may be received by the object 10 through the RF coil 26 during a reception mode. The transmission and reception switch 34 may be controlled by a control signal from an RF controller 56.

The monitor 40 may monitor or control the gantry 20 or devices mounted on the gantry 20. The monitor 40 may include a system monitor 42, an object monitor 44, a table controller 46, and a display controller 48.

The system monitor 42 may monitor and control a state of a magnetostatic field, a state of a gradient magnetic field, a state of an RF signal, a state of an RF coil, a state of a table, a state of a device measuring body information of an object, a power supply state, a state of a thermal exchanger, and a state of a compressor.

The object monitor 44 monitors a state of the object 10. For example, the object monitor 44 may include a camera for observing movement or position of the object 10, a respiration measurer for measuring the respiration of the object 10, an ECG measurer for measuring ECG of the object 10, or a temperature measurer for measuring a temperature of the object 10.

The table controller 46 controls movement of the table 28 where the object 10 is positioned. The table controller 46 may control the movement of the table 28 according to sequence control of a sequence controller 52. For example, during moving imaging of the object 10, the table controller 46 may continuously or discontinuously move the table 28 according to the sequence control of the sequence controller 52, and thus the object 10 may be imaged in a field of view (FOV) larger than that of the gantry 20.

The display controller 48 controls the display 29 and the display inside the gantry 20. For example, the display controller 48 may turn on or off the display 29 and the display inside the gantry 20, and may control a screen to be output on the display 29 and/or the display inside the gantry 20. For example, when a speaker is located inside or outside the gantry 20, the display controller 48 may turn on or off the speaker or control the speaker to output sound.

The system controller 50 may include the sequence controller 52 for controlling a sequence of signals formed in the gantry 20, and a gantry controller 58 for controlling the gantry 20 and devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operating station 60. The pulse sequence includes all information required to control the gradient amplifier 32, the RF transmitter 36, the RF receiver 38, and the transmission and reception switch 34, for example, may include information about strength, an application time, and an application timing of a pulse signal applied to the gradient coil 24.

The operating station 60 requests the system controller 50 to transmit pulse sequence information while controlling an overall operation of the MRI system.

The operating station 60 may include an image processor 62 for processing an MR signal received from the RF receiver 38, an output unit 64, and an input unit 66.

The image processor 62 processes an MR signal received from the RF receiver 38 to generate MR image data of the object 10.

The image processor 62 performs any one of various signal processes, such as amplification, frequency conversion, phase detection, low frequency amplification, and filtering, on an MR signal received by the RF receiver 38.

The image processor 62 may arrange digital data in a K-space (for example, also referred to as a Fourier space or frequency space) of a memory, and rearrange the digital data into image data via 2D or 3D Fourier transform.

The image processor 62 may perform a composition process or difference calculation process on image data if required. The composition process may include an addition process on a pixel or a maximum intensity projection (MIP) process. The image processor 62 may store rearranged image data and/or image data on which a composition process or difference calculation process is performed, in a memory (not shown) or on an external server.

Signal processes applied to MR signals by the image processor 62 may be performed in parallel. For example, a signal process may be performed on a plurality of MR signals received by a multi-channel RF coil in parallel so as to rearrange the plurality of MR signals as image data.

The output unit 64 may output image data generated or rearranged by the image processor 62 to the user. For example, the output unit 64 may output information required for the user to manipulate the MRI system, such as user interface (UI), user information, or object information. The output unit 64 may include a speaker, a printer, a cathode-ray tube (CRT) display, a liquid crystal display (LCD), a plasma display panel (PDP), an organic light-emitting device (OLED) display, a field emission display (FED), a light-emitting diode (LED) display, a vacuum fluorescent display (VFD), a digital light processing (DLP) display, a PFD display, a 3D display, or a transparent display, or any one of various output devices that are known to those of ordinary skill in the art.

The user may input object information, parameter information, a scan condition, a pulse sequence, or information about image composition or difference calculation by using the input unit 66. The input unit 66 may include a keyboard, a mouse, a trackball, a voice recognizer, a gesture recognizer, or a touch screen, or may include any one of other various input devices that are well known to one of ordinary skill in the art.

Although the signal transceiver 30, the monitor 40, the system controller 50, and the operating station 60 are shown and described as separate components in FIG. 1, some or all of these components may be implemented as a single component. Also, some or all of the functions of the signal transceiver 30, the monitor 40, the system controller 50, and the operating station 60 may be performed by another component or integrated in one component. For example, the image processor 62 converts an MR signal received by the RF receiver 38 into a digital signal, but such a conversion to a digital signal may be directly performed by the RF receiver 38 or the RF coil 26.

The gantry 20, the RF coil 26, the signal transceiver 30, the monitor 40, the system controller 50, and the operating station 60 may be connected to each other via wires or wirelessly, and when they are connected wirelessly, the MRI system may further include an apparatus (not shown) for synchronizing clocks therebetween. Communication between the gantry 20, the RF coil 26, the signal transceiver 30, the monitor 40, the system controller 50, and the operating station 60 may be performed by using a high-speed digital interface, such as low voltage differential signaling (LVDS), asynchronous serial communication, such as universal asynchronous receiver transmitter (UART), a low-delay network protocol, such as an error synchronous serial communication or controller area network (CAN), or optical communication, or any other communication method that is well known to one of ordinary skill in the art.

Figure 2:
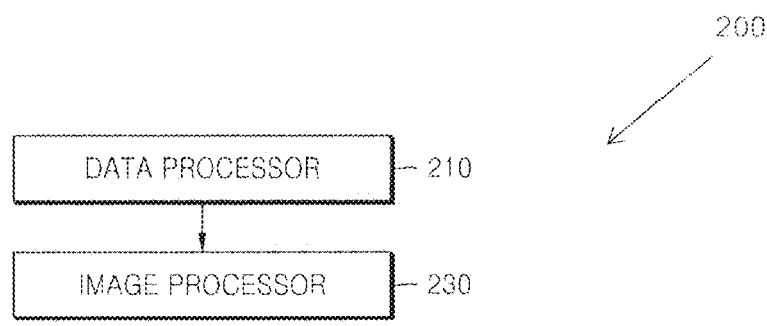
FIG. 2 is a diagram illustrating an MRI apparatus according to an exemplary embodiment.

FIG. 2 is a diagram illustrating an MRI apparatus 200 according to an exemplary embodiment. The MRI apparatus 200 may be incorporated into the MRI system 100 or may be separate from the MRI system 100 and may communicate with the MRI system 100 via a network.

Referring to FIG. 2, the MRI apparatus 200 according to an exemplary embodiment includes a data processor 210 and an image processor 230.

The MRI apparatus 200 is an apparatus that performs imaging on an MR image by using data acquired by a plurality of coil channels included in an RF multi-coil. For example, the MRI apparatus 200 is an apparatus that acquires a time space-based parallel MR image so as to image a moving object.

The MRI apparatus 200 may be connected by wire or wirelessly to the RF multi-coil that is the RF coil 26 included in the gantry 20. The data processor 210 may receive an MR signal sensed by the RF multi-coil.

The data processor 210 time-serially performs undersampling on MR signals respectively received by the plurality of coil channels included in the RF multi-coil to acquire undersampled K-t space data.

For example, the data processor 210 may correspond to the RF receiver 38. Alternatively, the data processor 210 may receive the MR signals, sensed by the RF multi-coil, from the RF receiver 38, and may be included in the operating station 60.

Figure 3:
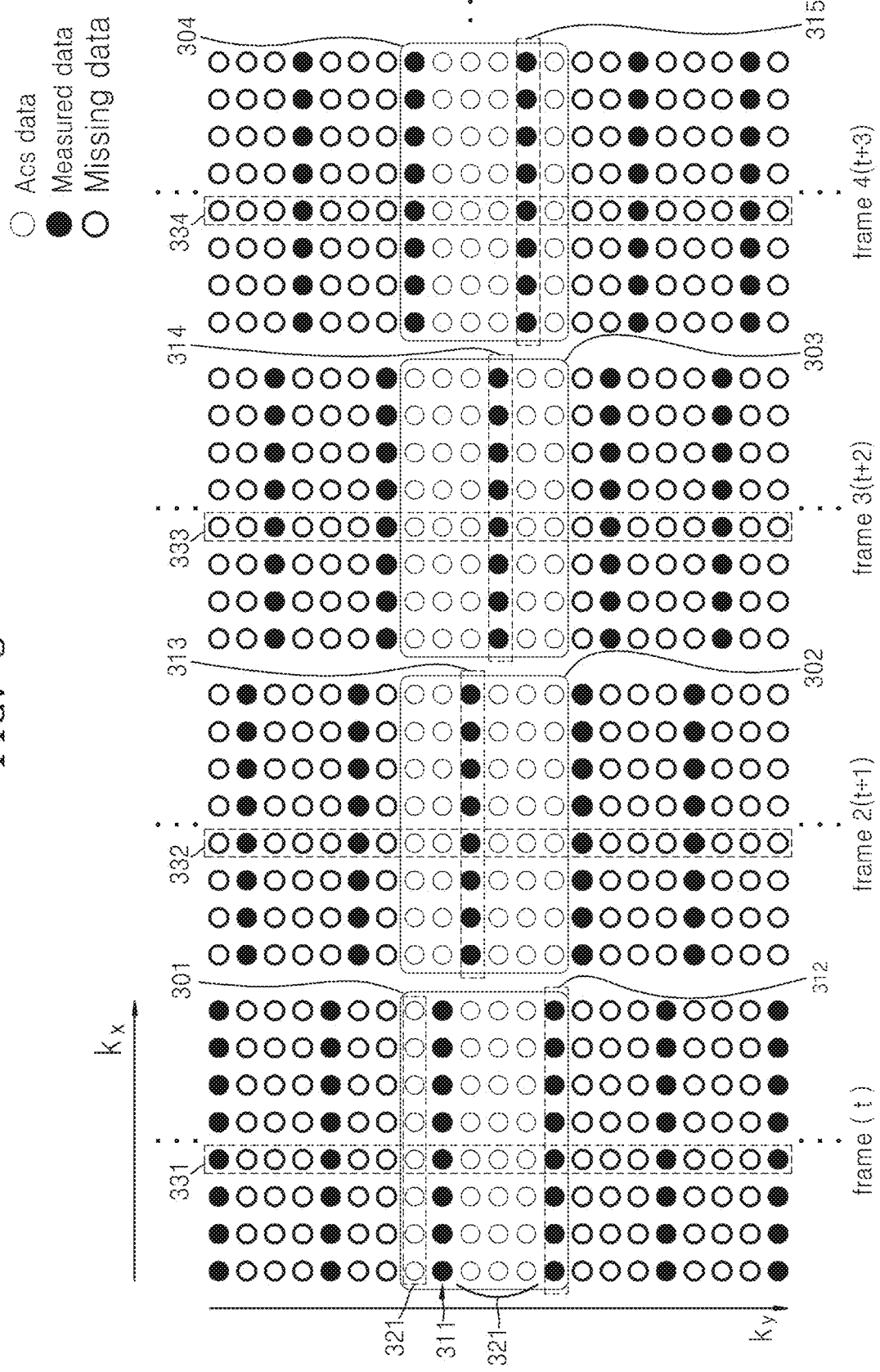
FIG. 3 is a diagram for describing an operation of a data processor of FIG. 2.

FIG. 3 is a diagram for describing an operation of acquiring the undersampled K-t space data by the data processor 210 of FIG. 2.

Referring to FIG. 3, the data processor 210 performs, at certain periodic intervals, sampling on the MR signals respectively received by the plurality of coil channels to acquire pieces of K-space data. The K-space data that is acquired at certain periodic intervals is referred to as K-t space data. For example, undersampling is performed at certain periodic intervals in a K-space corresponding to one channel coil, for acquiring the K-t space data.

Referring to FIG. 3, the K-t space data having a type of frame data is acquired at certain time intervals. For example, when acquiring the K-t space data at t-time intervals, frames 1, 2, 3, and 4 that are pieces of undersampled K-t space data are respectively acquired at times "t", "t+1", "t+2", and "t+3". In the undersampled K-t space data, an x axis indicates a frequency encoding direction in a Kx direction, and a y axis indicates a phase encoding direction in a Ky direction.

The data processor 210 may time-serially perform undersampling on the MR signals respectively received by the plurality of coil channels included in the RF multi-coil to obtain undersampled K-t space data having an echelon type.

For example, the data processor 210 may perform undersampling on the MR signals at one-line intervals in a K-space corresponding to each of the plurality of coil channels, and may additionally perform Nyquist-sampling in a central region of the K-space, thereby acquiring the undersampled K-t space data.

Hereinafter, pieces of line data that are acquired as an echelon type in the same regions 301, 302, 303, and 304 of a frame will be described as an example.

To describe FIG. 3 as an example, in acquiring the frame 1 at the time "t", n line data 311 and n+4 line data 312 are acquired by performing undersampling at four-line intervals. In acquiring the frame 2 at the time "t+1" subsequent to the time "t", n+1 line data 313 adjacent to the n line data 311 is acquired. In acquiring the frame 3 at the time "t+2" subsequent thereto, n+2 line data 314 adjacent to the n+1 line data 313 is acquired. In acquiring the frame 4 at the time "t+3" subsequent thereto, n+3 line data 315 adjacent to the n+2 line data 314 is acquired. Hereinafter, line data for which a signal value is acquired through sampling is referred to as acquired line data or measured data.

For example, in order to calculate an initial value of a time-space correlation coefficient, an auto-calibration signal (ACS) region may be set, and a signal value of a whole ACS region may be measured. For example, in the region 301, which is set as the ACS region, the n line data 311 and the n+4 line data 312 are pieces of acquired line data, and other pieces of line data 321 may be pieces of calibration line data.

Figure 4:
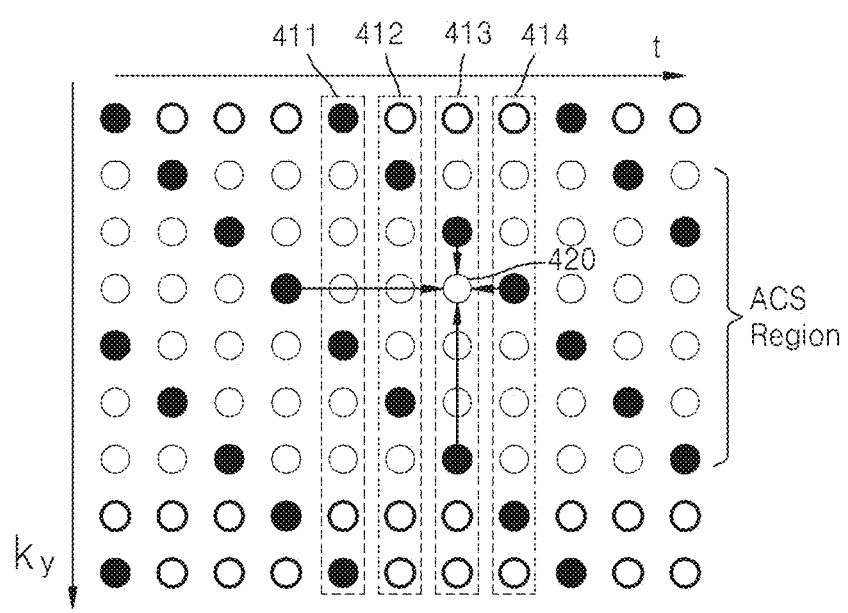
FIG. 4 is a diagram illustrating undersampled K-t space data.

FIG. 4 is a diagram illustrating undersampled K-t space data. The unacquired K-space lines are obtained by using a measured signal that is undersampled data and an auto-calibration signal (ACS) line.

Referring to FIG. 4, the undersampled K-t space data generated by the data processor 210 is illustrated. In the K-t space data, an x axis indicates time, and a y axis indicates a Ky direction. In FIG. 4, region data 411 may be data obtained through undersampling at the time "t" and may correspond to data 331, region data 412 may be data obtained through undersampling at the time "t+1" and may correspond to data 332, region data 413 may be data obtained through undersampling at the time "t+2" and may correspond to data 333, and region data 414 may be data obtained through undersampling at the time "t+3" and may correspond to data 334.

The image processor 230 acquires the time-space correlation coefficient, based on noise information of the plurality of coil channels and restores pieces of unacquired line data from the undersampled K-t space data by using the time-space correlation coefficient to acquire restored K-t space data. The image processor 230 may correspond to the image processor 62 or may be an additional image processor. First, the image processor 230 acquires the noise information of the plurality of coil channels included in the RF multi-coil. For example, the image processor 230 may drive the RF multi-coil to acquire a noise map of the plurality of coil channels. Alternatively, the image processor 230 may receive the noise map of the plurality of coil channels from the outside.

Alternatively, the image processor 230 may transmit an RF signal to inside the gantry 20 through the RF multi-coil, and receive an internal noise signal of the gantry 20, which is generated in correspondence with the transmitted RF signal and acquired through each of the plurality of coil channels. The acquired noise signal is used as noise information. For example, when the RF multi-coil includes an RF receive coil and an RF transmit coil, the image processor 230 may turn off the RF receive coil and a gradient coli, and drive only the RF transmit coil to acquire the noise signal of the gantry 20 of the MRI system of FIG. 1 through each of a plurality of coil channels included in the RF receive coil.

The image processor 230 calculates the time-space correlation coefficient, based on the acquired noise information.

The time-space correlation coefficient is a coefficient value based on a spatial interaction and a temporal interaction between a calibration signal (included in calibration line data) and an acquired signal included in acquired line data. For example, in order to calculate a signal value 420, the time-space correlation coefficient may be acquired by using signal values of temporally adjacent frames and signal values (which are acquired at the same time) of adjacent lines.

For example, the image processor 230 may calculate the time-space correlation coefficient, based on noise information of the plurality of coil channels, in order for noise of the restored K-t space data to be reduced. That is, when estimating the time-space correlation coefficient by using an adaptive filter, the image processor 230 may consider noise of each channel coil of the RF multi-coil. Therefore, in restoring a final MR image, the image processor 230 may restore a noise-removed MR image because a degree of contribution of corresponding K-space data is reduced when noise of a corresponding coil is great.

An operation, in which the image processor 230 acquires the time-space correlation coefficient, will be described below in detail with reference to FIGS. 5 and 6.

Figure 5A:
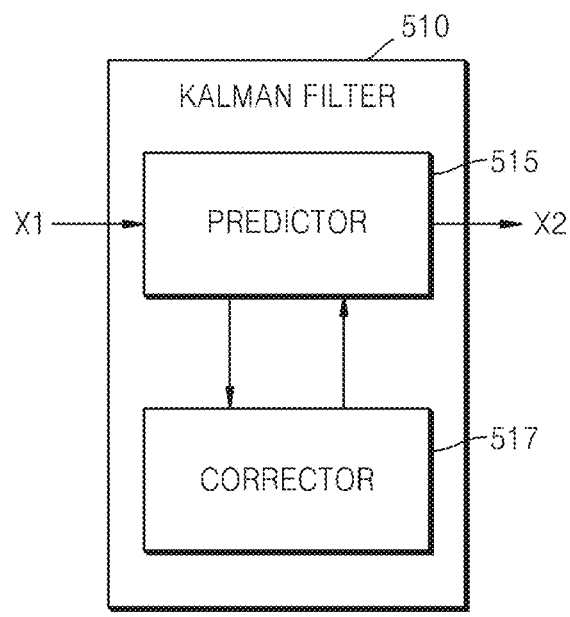
FIGS. 5A and 5B are diagrams for describing a Kalman filter and an operation of acquiring a time-space correlation.
Figure 5B:
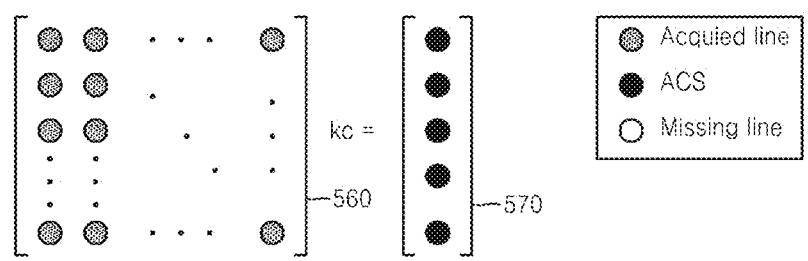

FIGS. 5A and 5B are diagrams for describing a Kalman filter 510 and an operation of acquiring a time-space correlation. FIG. 5A is a diagram for describing a structure of the Kalman filter 510. FIG. 5B is a diagram for describing an operation of acquiring the time-space correlation.

The image processor 230 may correct line data acquired from the undersampled K-t space data by using the Kalman filter, and calculate the time-space correlation coefficient by using the corrected line data.

Referring to FIG. 5A, the Kalman filter includes a predictor 515 and a corrector 517. The Kalman filter is an algorithm that uses a series of measurements observed over time, containing noise (random variations) and other inaccuracies, and produces estimates of unknown variables that tend to be more precise than those based on a single measurement alone. The Kalman filter operates recursively on streams of noisy input data to produce a statistically optimal estimate of the underlying system state.

Thus, the Kalman filter 510 is a recursive filter that traces a state of a linear dynamical system including noise, and estimates a current value, based on a previously estimated value or an initial value.

For example, the predictor 515 calculates an optimal estimate of the current state which is predicted from the noisy input data, based on a previously estimated state X1 or an initial state. Such an operation is referred to as a prediction step. The corrector 517 calculates an accurate state, based on a state predicted by the predictor 515 and an actually measured state, to output a corrected state X2. Such an operation is referred to as a correction step or an update step. A structure and operation of the Kalman filter 510 is known to those of ordinary skill in the art, and thus, its detailed description is not provided.

The image processor 230 calculates a gain value of the Kalman filter 510 based on the noise information of the plurality of coil channels, corrects a signal value of the line data acquired from the undersampled K-t space data by using the calculated gain value, and calculates the time-space correlation coefficient by using the corrected signal value.

For example, the image processor 230 calculates a gain value Kn by using noise information (v: measurement noise vector with covariance matrix R) in a region of a coil channel corresponding to pieces of acquired line data (yn: target signal matrix) that are used to calculate the time-space correlation coefficient. The image processor 230 corrects the signal value of the acquired line data by using the calculated gain value Kn. The image processor 230 acquires the time-space correlation coefficient by using the corrected signal value.

Referring to FIG. 5B, a left term 560 of a matrix operation for calculating the time-space correlation coefficient Kc includes signal values of pieces of acquired line data, and a right term 570 of the matrix operation includes signal values of pieces of calibration line data. Therefore, the left term 560 of the matrix operation is moved to a right term, and by performing an inverse matrix operation, the time-space correlation coefficient Kc may be calculated. The image processor 230 may add signal values, obtained through correction by the Kalman filter 510, into the left term 560 of the matrix operation to calculate the time-space correlation coefficient Kc.

For example, the image processor 230 restores unacquired line data from the undersampled K-t space data by using the acquired time-space correlation coefficient to acquire restored K-t space data.

Figure 6:
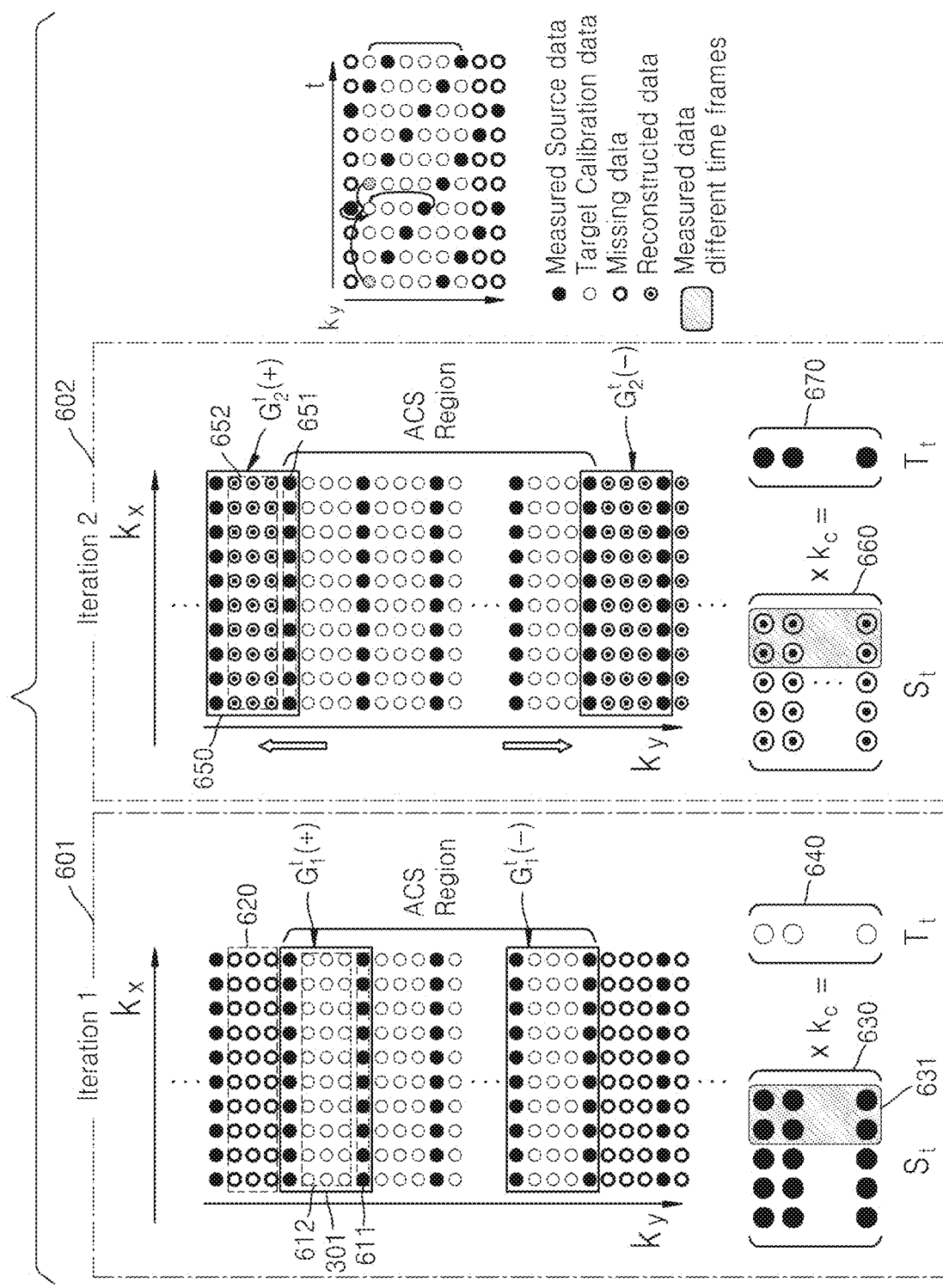
FIG. 6 shows diagrams for describing an operation of an image processor.

FIG. 6 is a diagram for describing an operation of the image processor 230.

Referring to an Iteration 1 portion 601 of FIG. 6, the image processor 230 acquires line data 611 from undersampled K-t space data, corrects the acquired line data 611 by using noise information corresponding thereto, and substitutes the corrected value into a left term 630 of a matrix operation. For example, the left term 630 may include signal values of pieces of temporally adjacent K-t space data. A right term 640 of the matrix operation may include signal values included in calibration line data 612.

The time-space correlation coefficient Kc is calculated by performing an inverse matrix operation. K-t space data is restored by restoring pieces of unacquired line data 620 by using the time-space correlation coefficient Kc.

For example, the time-space correlation coefficient Kc is acquired, and then, the image processor 230 may inversely estimate acquired line data included in the undersampled K-t space data by using the restored K-t space data and the acquired time-space correlation coefficient.

Referring to an Iteration 2 portion 602 of FIG. 6, the image processor 230 substitutes pieces of restored K-t space data 652 into a left term 660 of a matrix operation, and performs an arithmetic operation on the left term 660 and the time-space correlation coefficient Kc, thereby acquiring a right term 670. The right term 670 is a signal value corresponding to acquired line data 651, namely, is an inversely estimated value.

When a difference between a value of inversely estimated line data (for example, a signal value included in the right term 670) and a value of acquired line data (for example, a before-inverse-estimation signal value, namely, a value included in line data acquired through sampling) is greater than a threshold TH1, the image processor 230 may repeat an operation of acquiring the time-space correlation coefficient Kc until the difference becomes less than or equal to the threshold TH1.

For example, until the before-inverse-estimation signal value and an inversely estimated signal value become equal to or less than or equal to the threshold TH1, the image processor 230 may again acquire the time-space correlation coefficient Kc by using the inversely estimated signal value, restore pieces of restored line data by using the again acquired time-space correlation coefficient, and repeat an operation of inversely estimating pieces of acquired line data by using the restored pieces of line data.

The threshold TH1 is a value for determining the difference as converging, and may be set to a certain value that is experimentally obtained in consideration of a quality of a final MR image.

The image processor 230 may perform a spatial transform on pieces of restored K-t space data respectively corresponding to the plurality of coil channels to generate MR images by channel. The image processor 230 may generate a final MR image by using the MR images by channel.

For example, the image processor 230 may perform an inverse Fourier transform or an inverse fast Fourier transform for converting the pieces of restored K-t space data from a frequency domain to a spatial domain, thereby generating the MR images by channel.

The image processor 230 may synthesize the MR images by channel to generate the final MR image. For example, the image processor 230 may calculate a sum of squares or complex sum of the MR images by channel to acquire the final MR image.

FIG. 7 is a flowchart of an MRI method 700 according to an exemplary embodiment. The MRI method 700 according to an exemplary embodiment has the same technical features as that of the MRI apparatus 200 of FIG. 2, and thus, the same descriptions provided with regard to FIG. 2 are not repeated.

Referring to FIG. 7, the MRI method 700 time-serially performs undersampling on MR signals respectively received by the plurality of channels included in the RF multi-coil to acquire undersampled K-t space data, in operation 710. Operation 710 may be performed by the data processor 210.

A time-space correlation coefficient is acquired based on noise information of the plurality of coil channels, in operation 720. Operation 720 may be performed by the image processor 230.

In operation 730, restored K-t space data is acquired by restoring pieces of unacquired line data from the undersampled K-t space data by using the time-space correlation coefficient that is acquired in operation 720. Operation 730 may be performed by the image processor 230.

FIG. 8 is a flowchart of an MRI method 800 according to an exemplary embodiment. The MRI method 800 according to an exemplary embodiment has the same technical features as that of the MRI apparatus 200 described above with reference to FIG. 2, and moreover, operations 810, 820, and 830 of FIG. 8 correspond to the operations 710, 720, and 730 of FIG. 7. Thus, the same descriptions provided with regard to FIGS. 2 and 7 are not repeated.

Referring to FIG. 8, operation 810 may time-serially perform undersampling on an MR signal to acquire the undersampled K-t space data having the echelon type as illustrated in FIG. 3.

Moreover, operation 810 may include an operation, which performs undersampling on the MR signal at one-line intervals in a K-space corresponding to each of the plurality of coil channels, and an operation that additionally performs Nyquist-sampling in a central region of the K-space to acquire the undersampled K-t space data.

Operation 820 may calculate the time-space correlation coefficient, based on the noise information of the plurality of coil channels, in order for noise of restored K-t space data to be reduced.

Moreover, operation 820 may include an operation, which corrects line data acquired from the undersampled K-t space data by using a Kalman filter, and an operation that calculates the time-space correlation coefficient by using the corrected line data.

For example, operation 820 may include an operation that calculates a gain value of the Kalman filter based on the noise information of the plurality of coil channels, an operation that corrects a signal value of the line data acquired from the undersampled K-t space data by using the calculated gain value, and an operation that calculates the time-space correlation coefficient by using the corrected signal value.

In operation 840, the MRI method 800 inversely estimates acquired line data included in the undersampled K-t space data by using the restored K-t space data and the time-space correlation coefficient. Operation 840 may be performed by the image processor 230.

In operation 850, the MRI method 800 determines whether a difference between a value of the inversely estimated line data and a value of the acquired line data is greater than the threshold TH1. Operation 850 may be performed by the image processor 230.

When it is determined in operation 850 that the difference between the value of the inversely estimated line data and the value of the acquired line data is greater than the threshold TH1, the MRI method 800 repeats an operation of acquiring the time-space correlation coefficient until the difference becomes less than or equal to the threshold TH1.

When it is determined in operation 850 that the difference between the value of the inversely estimated line data and the value of the acquired line data is less than or equal to the threshold TH1, the MRI method 800 performs a spatial transform on pieces of restored K-t space data respectively corresponding to the plurality of coil channels to generate MR images by channel, in operation 860. Operation 860 may be performed by the image processor 230.

In operation 870, the MRI method 800 acquires a final MR image by using the MR images by channel. Operation 870 may be performed by the image processor 230.

Figure 9A:
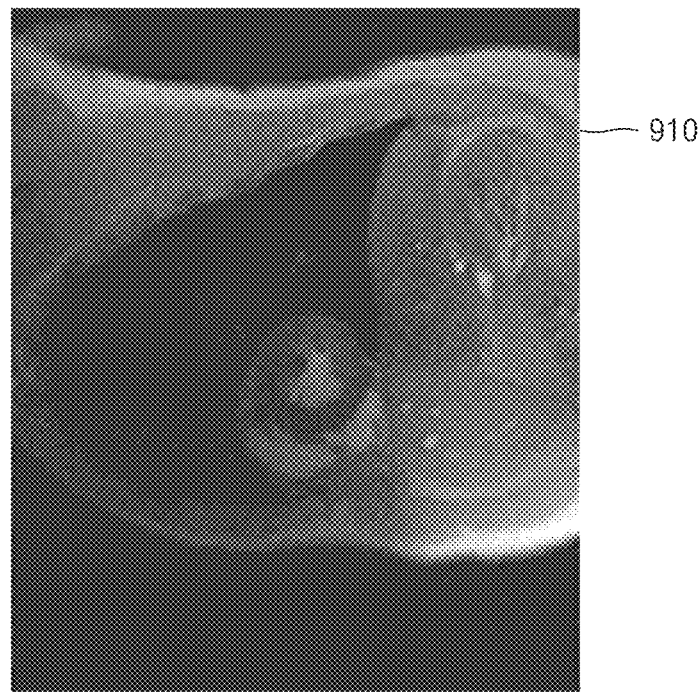
FIGS. 9A and 9B are diagrams illustrating a final MR image generated by the MRI apparatus and method according to an exemplary embodiment.
Figure 9B:
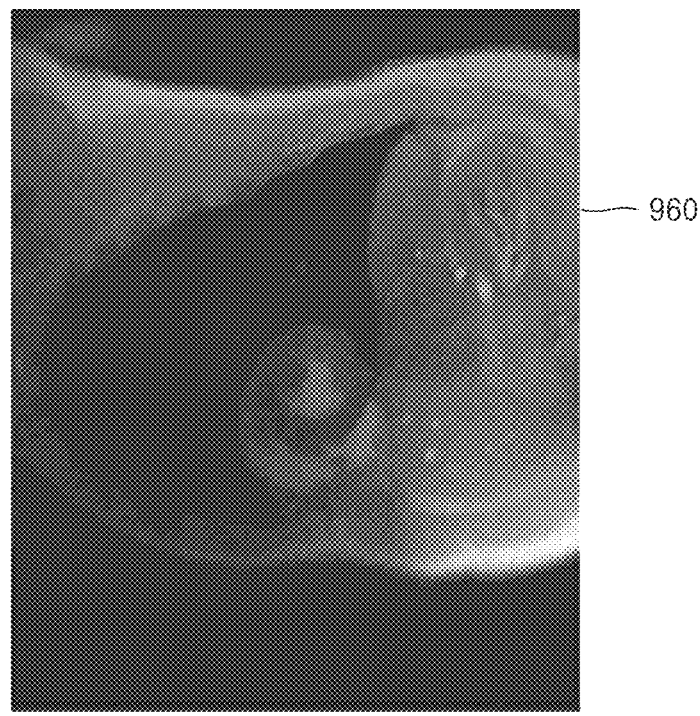

FIGS. 9A and 9B are final MR images generated by the MRI apparatus and method according to an exemplary embodiment.

An image 910 of FIG. 9A is a final MR image that is acquired by restoring undersampled K-t space data according to the GRAPPA technique.

An image 960 of FIG. 9B is a final MR image that is acquired by restoring the undersampled K-t space data by using a time-space correlation coefficient that is acquired based on noise of the coil channels according to the MRI apparatus and method according to an exemplary embodiment.

In comparison with the image 910, it may be seen that noise and aliasing artifacts are substantially eliminated in the image 960.

Figure 10A:
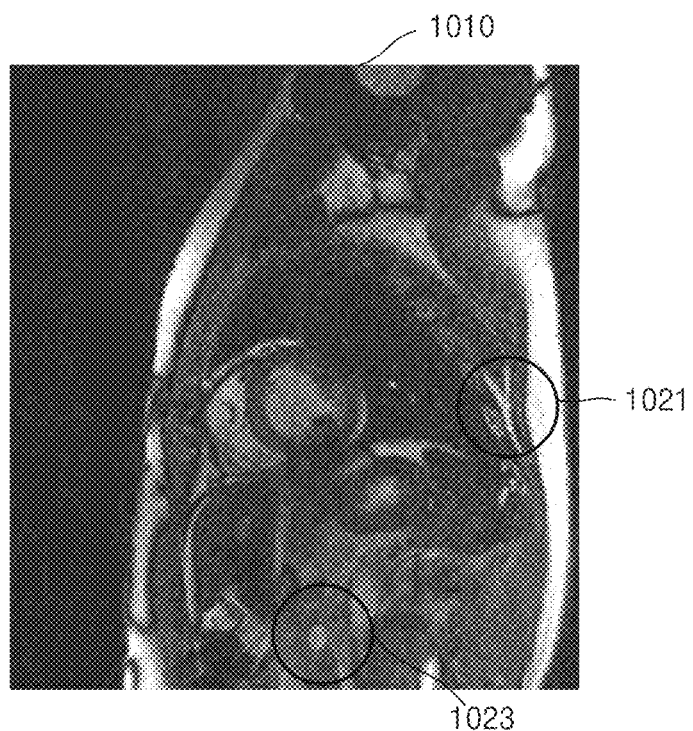
FIGS. 10A and 10B are diagrams illustrating a final MR image generated by the MRI apparatus and method according to an exemplary embodiment.
Figure 10B:
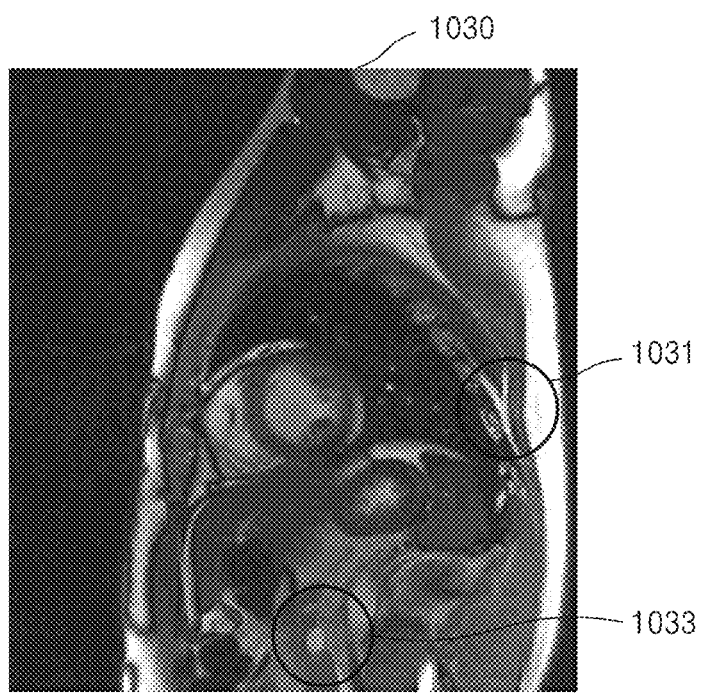

FIGS. 10A and 10B are diagrams illustrating a final MR image generated by the MRI apparatus and method according to an exemplary embodiment.

An image 1010 of FIG. 10A is a final MR image that is acquired by restoring undersampled K-t space data according to the GRAPPA technique.

An image 1030 of FIG. 10B is a final MR image that is acquired by restoring the undersampled K-t space data by using a time-space correlation coefficient that is acquired based on noise of the coil channels according to the MRI apparatus and method according to an exemplary embodiment.

Referring to regions 1021 and 1023 of the image 1010, it may be seen that a boundary is unclear and a quality of an image is degraded due to a lot of noise in the image 1010. On the other hand, referring to regions 1031 and 1033 of the image 1030, it may be seen that a boundary is clearly expressed because there is hardly any noise in the image 1030.

Figure 11A:
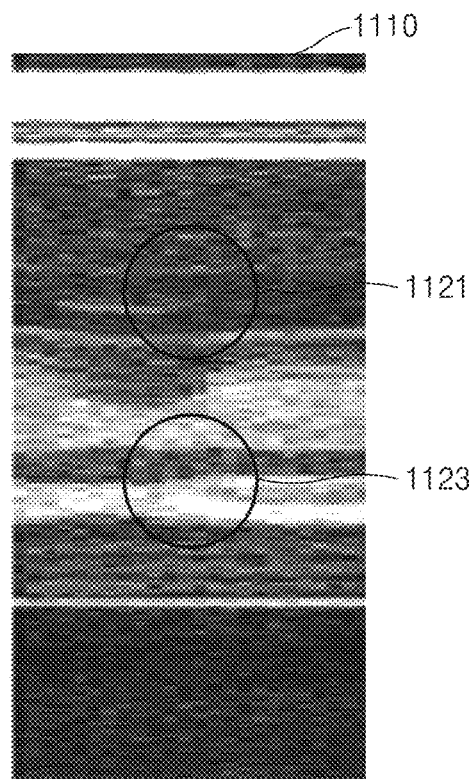
FIGS. 11A and 11B are diagrams illustrating a final MR image generated by the MRI apparatus and method according to an exemplary embodiment.
Figure 11B:
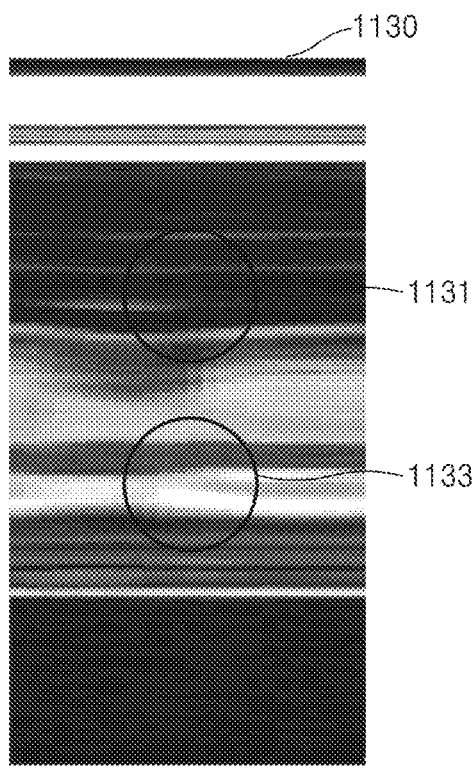

FIGS. 11A and 11B are final MR images generated by the MRI apparatus and method according to an exemplary embodiment.

An image 1110 of FIG. 11A is a final MR image that is acquired by restoring undersampled K-t space data according to the GRAPPA technique.

An image 1130 of FIG. 11B is a final MR image that is acquired by restoring the undersampled K-t space data by using a time-space correlation coefficient that is acquired based on noise of the coil channels according to the MRI apparatus and method according to an exemplary embodiment.

The images 1110 and 1130 are images that are acquired by imaging a blood vessel, i.e., blood, which is a moving object.

Referring to regions 1121 and 1123 of the image 1110, it may be seen that a boundary is unclear and a quality of an image is degraded due to a lot of noise in the image 1110. On the other hand, referring to regions 1131 and 1133 of the image 1130, it may be seen that a boundary is clearly expressed because there is hardly any noise in the image 1130.

As described above, according to one or more of exemplary embodiments, a noise-removed image is restored by considering noise of each channel coil when estimating a time-space correlation coefficient.

For example, a time-space correlation coefficient is corrected by inversely estimating acquired line data by using a restored image, thereby enhancing an accuracy of the time-space correlation coefficient. Also, aliasing artifacts are removed because the accuracy of the time-space correlation coefficient.

The exemplary embodiments can be written as computer programs and can be implemented in computers that execute the programs using a computer-readable recording medium.

Examples of the computer-readable recording medium include magnetic storage media (e.g., ROM, floppy disks, hard disks, etc.), optical recording media (e.g., CD-ROMs or DVDs), etc.

The described-above exemplary embodiments and advantages are merely exemplary and are not to be construed as limiting. The present teaching can be readily applied to other types of apparatuses. The description of exemplary embodiments is intended to be illustrative, and not to limit the scope of the claims, and many alternatives, modifications, and variations will be apparent to those skilled in the art.

What is claimed is:

1. A magnetic resonance imaging (MRI) apparatus comprising:
   a processor configured to time-serially perform undersampling on MR signals respectively received by coil channels of a radio frequency (RF) multi-coil to acquire undersampled K-t space data; and
   an image processor configured to acquire a time-space correlation coefficient based on noise information of the coil channels, to restore pieces of unacquired line data from the undersampled K-t space data by using the time-space correlation coefficient, to acquire restored K-t space data, and to inversely estimate acquired line data included in the undersampled K-t space data by using the restored K-t space data and the time-space correlation coefficient,
   wherein, when a difference between a value of the inversely estimated line data and a value of the acquired line data is greater than a threshold, the image processor repeats operations of acquiring the time-space correlation coefficient, restoring the pieces of the unacquired line data, and inversely estimating the acquired line data until the difference becomes less than or equal to the threshold.

2. The MRI apparatus of claim 1, wherein the image processor is configured to determine the noise information of the coil channels, and to calculate the time-space correlation coefficient in consideration of the determined noise information of the coil channels, so that noise of the restored K-t space data is substantially reduced.

3. The MRI apparatus of claim 1, wherein the image processor is configured to correct the acquired line data included in the undersampled K-t space data by using a Kalman filter, and to calculate the time-space correlation coefficient by using the corrected acquired line data.

4. The MRI apparatus of claim 3, wherein the image processor is configured to determine the noise information of the coil channels, to calculate a gain value of the Kalman filter based on the determined noise information of the coil channels, to correct a signal value of the acquired line data included in the undersampled K-t space data by using the calculated gain value, and to calculate the time-space correlation coefficient by using the corrected signal value.

5. The MRI apparatus of claim 1, wherein the noise information comprises a noise map of the coil channels.

6. The MRI apparatus of claim 1, wherein, when an RF signal is transmitted from the RF multi-coil, the noise information is generated in correspondence with the transmitted RF signal, and includes an internal noise signal of a gantry that is acquired through the coil channels.

7. The MRI apparatus of claim 1, wherein the processor is configured to time-serially perform the undersampling on the MR signals to acquire the undersampled K-t space data having an echelon type.

8. The MRI apparatus of claim 7, wherein the processor is configured to acquire the undersampled K-t space data by performing the undersampling on the MR signals at one-line intervals in a K-space corresponding to the coil channels and additionally performing a Nyquist-sampling in a central region of the K-space.

9. The MRI apparatus of claim 1, wherein the image processor is configured to perform a spatial transform on pieces of the restored K-t space data respectively corresponding to the coil channels to generate MR images by channel, and to acquire a final MR image by using the MR images by channel.

10. The MRI apparatus of claim 9, wherein the image processor is configured to perform an inverse Fourier transform on the pieces of restored K-t space data to generate the MR images by channel.

11. The MRI apparatus of claim 9, wherein the image processor is configured to calculate a sum of squares or a complex sum of the MR images by channel to acquire the final MR image.

12. A magnetic resonance imaging (MRI) method comprising:
   (a) time-serially performing undersampling on MR signals respectively received by coil channels included in a radio frequency (RF) multi-coil to acquire undersampled K-t space data;
   (b) acquiring a time-space correlation coefficient, based on noise information of the coil channels;
   (c) restoring pieces of unacquired line data from the undersampled K-t space data by using the time-space correlation coefficient, to acquire restored K-t space data;
   (d) inversely estimating acquired line data included in the undersampled K-t space data by using the restored K-t space data and the time-space correlation coefficient; and
   in response to determining that a difference between a value of the inversely estimated line data and a value of the acquired line data is greater than a threshold, repeating operations (b) to (d) until the difference becomes less than or equal to the threshold.

13. The MRI method of claim 12, wherein the acquiring the time-space correlation coefficient comprises:
   determining noise information of the coil channels; and
   calculating the time-space correlation coefficient in consideration of the determined noise information of the coil channels, to reduce noise of the restored K-t space data.

14. The MRI method of claim 12, wherein the acquiring the time-space correlation coefficient comprises:
   correcting the acquired line data included in the undersampled K-t space data by using a Kalman filter; and
   calculating the time-space correlation coefficient by using the corrected acquired line data.

15. The MRI method of claim 14, wherein the acquiring the time-space correlation coefficient comprises:
   calculating a gain value of the Kalman filter based on the noise information of the coil channels;
   correcting a signal value of the acquired line data included in the undersampled K-t space data by using the calculated gain value; and
   calculating the time-space correlation coefficient by using the corrected signal value.

16. The MRI method of claim 12, wherein the noise information of the coil channels comprises a noise map of the coil channels.

17. The MRI method of claim 12, wherein the acquiring the time-space correlation coefficient comprises determining noise information of the coil channels by:
   transmitting an RF signal from the RF multi-coil; and
   acquiring, through the coil channels, an internal noise signal of a gantry, the internal noise signal being generated in correspondence with the transmitted RF signal.

18. The MRI method of claim 12, wherein the time-serially performing the undersampling comprises:
   time-serially performing the undersampling on the MR signals to acquire the undersampled K-t space data having an echelon type.

19. The MRI method of claim 18, further comprising:
   performing the undersampling on the MR signals at one-line intervals in a K-space corresponding to the coil channels and additionally performing a Nyquist-sampling in a central region of the K-space, to acquire the undersampled K-t space data.

20. The MRI method of claim 12, further comprising:
   performing a spatial transform on pieces of the restored K-t space data respectively corresponding to the coil channels to generate MR images by channel; and
   acquiring a final MR image by using the MR images by channel.

21. The MRI method of claim 20, wherein the generating the MR images by channel comprises:
   performing an inverse Fourier transform on the pieces of restored K-t space data to generate the MR images by channel.

22. The MRI method of claim 20, wherein the acquiring the final MR image comprises:
   calculating a sum of squares or a complex sum of the MR images by channel to acquire the final MR image.

\* \* \* \* \*